(12) United States Patent
Sakurai

(10) Patent No.: US 8,742,584 B2
(45) Date of Patent: Jun. 3, 2014

(54) SEMICONDUCTOR DEVICE

(75) Inventor: Daisuke Sakurai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/415,338

(22) Filed: Mar. 8, 2012

(65) Prior Publication Data

US 2012/0168961 A1 Jul. 5, 2012

Related U.S. Application Data

(63) Continuation of application No. PCT/JP2010/005380, filed on Sep. 1, 2010.

(30) Foreign Application Priority Data

Nov. 18, 2009 (JP) .................. 2009-262761

(51) Int. Cl.
*H01L 23/48* (2006.01)
*H01L 23/522* (2006.01)
*H01L 29/40* (2006.01)

(52) U.S. Cl.
USPC ........... 257/758; 257/774; 438/612; 438/622; 438/672

(58) Field of Classification Search
USPC ......................... 257/393, 774, 758
See application file for complete search history.

(56) References Cited

U.S. PATENT DOCUMENTS

| 6,297,563 | B1 | 10/2001 | Yamaha |
| 6,858,885 | B2 * | 2/2005 | Ebara ........................... 257/173 |
| 7,038,280 | B2 * | 5/2006 | Righter ........................ 257/355 |
| 7,312,530 | B2 * | 12/2007 | Hashimoto et al. ........... 257/758 |
| 2002/0006717 | A1 | 1/2002 | Yamaha |
| 2003/0213980 | A1 | 11/2003 | Tanaka et al. |
| 2005/0093161 | A1 | 5/2005 | Tanaka et al. |
| 2005/0146042 | A1 | 7/2005 | Yamaha |
| 2006/0001167 | A1 | 1/2006 | Tanaka et al. |
| 2006/0001169 | A1 | 1/2006 | Tanaka et al. |
| 2006/0097396 | A1 * | 5/2006 | Kamiyama et al. ........... 257/758 |
| 2006/0138662 | A1 | 6/2006 | Yamaha |
| 2007/0063292 | A1 * | 3/2007 | Ueda ............................. 257/393 |
| 2010/0263913 | A1 * | 10/2010 | Daubenspeck et al. ....... 174/250 |

FOREIGN PATENT DOCUMENTS

| JP | 9-246313 | 9/1997 |
| JP | 2000-114309 | 4/2000 |
| JP | 2005-005564 | 1/2005 |
| JP | 2005-116788 | 4/2005 |
| JP | 2005-327913 | 11/2005 |
| JP | 2006-108329 | 4/2006 |
| JP | 2006-128720 | 5/2006 |

OTHER PUBLICATIONS

International Search Report of PCT Application No. PCT/JP2010/005380 dated on Nov. 2, 2010.

* cited by examiner

*Primary Examiner* — Olik Chaudhuri
*Assistant Examiner* — John M Parker
(74) *Attorney, Agent, or Firm* — Panasonic Patent Center

(57) ABSTRACT

An externally connecting electrode is formed above a semiconductor substrate with interlayer insulation films and disposed in the externally connecting electrode. The externally connecting electrode has a pad metal layer whose upper surface is exposed, a first metal layer formed between the pad metal layer and the semiconductor substrate, and at least two first vias which penetrate the interlayer insulation film and electrically connect the pad metal layer to the first metal layer and are formed in the interlayer insulation film. The maximum interval b between the first vias is larger than the width a of the pad metal layer.

17 Claims, 6 Drawing Sheets

SEMICONDUCTOR DEVICE

BACKGROUND

1. Technical Field

The present invention relates to a semiconductor device, and more particularly to a semiconductor device provided with an input/output pad (externally connecting electrode) directly above an element formation region.

2. Background Art

Recently, in tandem with the spread of information techniques, an electronic device such as a computer or a mobile phone is required to increase speed as its ability. Accordingly, performance of a semiconductor element represented by a system LSI (Large Scale Integration) having a great effect on performance of the electronic device is inevitably required to further increase speed. However, the increase in speed of the semiconductor element is greatly hampered by a delay of a MOS transistor itself, and a wiring delay of a wiring itself provided as an upper layer thereof and due to parasitic capacity between the wirings.

Conventionally, the delay of the MOS transistor itself is reduced by a miniaturization technique to reduce a gate length. However, as the delay of the MOS transistor itself is reduced due to development of the miniaturization technique, the problem of the wiring delay is brought to the fore. Thus, to reduce the wiring delay, an insulation film having low permittivity (low permittivity film) is used for an insulation film buried between the wirings to reduce the wiring delay.

However, the low permittivity film is considerably reduced in mechanical strength compared to a silicon oxide film conventionally employed. This becomes problematic at the time of assembling process for packaging the semiconductor element, especially at the time of wire bonding process after a diffusion process for forming a circuit with a semiconductor. More specifically, when wire bonding is performed on a pad formed in the semiconductor element, an impact load at the time of wire bonding is transmitted via the pad to an interlayer insulation film provided just under the pad and considerably deforms the interlayer insulation film because the mechanical strength of the interlayer insulation film is not enough. This deformation causes a crack in the interlayer insulation film, which greatly affects reliability of quality of the semiconductor element itself.

Thus, in a conventional example, a metal layer is formed just under the pad with the interlayer insulation film interposed between them, and the formed metal layer and the pad are connected by a connection plug, so that the metal layer receives an impact applied to the interlayer insulation film at the time of bonding. Furthermore, a via prevents the metal layer from being deformed due to the applied impact, in the direction of the impact, in order to improve the mechanical strength of the interlayer insulation film formed just under the pad (refer to Unexamined Japanese Patent Publication No. 2000-114309, for example). As a result, the impact transmitted to the interlayer insulation film at the time of bonding can be reduced, and the interlayer insulation film is prevented from being damaged such as peeled and cracked.

However, according to the above configuration, a stress between the pad provided on a bonding surface of the interlayer insulation film, and the interlayer insulation film is great, and when a film having low permittivity, that is, a low-k film is used for the interlayer insulation film, a crack is generated in the interlayer insulation film at the time of probing, wire bonding, or dicing.

In order to solve this problem, a structure is conventionally proposed as will be described below (refer to Unexamined Japanese Patent Publication No. 2005-116788, for example). FIG. 6 shows a cross-sectional configuration of a semiconductor device according to a conventional example. As shown in FIG. 6, the semiconductor device according to the conventional example has interlayer insulation film 102, interlayer insulation film 103, interlayer insulation film 104, interlayer insulation film 105, and interlayer insulation film 106 sequentially formed on silicon semiconductor substrate 101, and bonding pad 107 formed on interlayer insulation film 106. Here, a plurality of lattice-shaped vias 132, 142, 152, and 162 are provided so as to penetrate the interlayer insulation films 102 to 106 under bonding pad 107, so that they separate the bonding surfaces of interlayer insulation films 102 to 106 between a region under bonding pad 7 and a region outside it, and divide the bonding surfaces of interlayer insulation films 102 to 106 in the region under bonding pad 107. Thus, the structure to support bonding pad 107 is proposed by providing vias 132 to 162. Here, the low permittivity film is used for at least one of interlayer insulation films 102 to 106.

It is described that since vias 132 to 162 divide the bonding surfaces of interlayer insulation films 102 to 106 into several parts, the stress to interlayer insulation films 102 to 106 are reduced, so that interlayer insulation films 102 to 106 can be prevented from being peeled, according to this structure.

SUMMARY

According to the present invention, a semiconductor device is configured such that a maximum interval between vias formed between a bonding pad (externally connecting electrode) and a metal layer provided under the bonding pad with an insulation film interposed therebetween is larger than a width of the bonding pad.

More specifically, a first semiconductor device according to the present invention includes an externally connecting electrode formed on a semiconductor substrate with at least two interlayer insulation films disposed in the externally connecting electrode The externally connecting electrode has a first metal layer having an exposed upper surface, a second metal layer formed between the first metal layer and the semiconductor substrate, a third metal layer formed between the first metal layer and the second metal layer, and at least two first vias penetrating a first interlayer insulation film provided between the second metal layer and the third metal layer and electrically connecting the second metal layer to the third metal layer. A maximum interval between the first vias is larger than a width of the first metal layer.

A second semiconductor device according to the present invention includes an externally connecting electrode formed on a semiconductor substrate with at least two interlayer insulation films disposed in the externally connecting electrode. The externally connecting electrode has a first metal layer having an exposed upper surface, a second metal layer formed between the first metal layer and the semiconductor substrate, a third metal layer formed between the first metal layer and the second metal layer, a fourth metal layer formed between the first metal layer and the third metal layer, a fifth metal layer formed between the third metal layer and the second metal layer, at least two first vias penetrating a first interlayer insulation film provided between the fifth metal layer and the second metal layer and electrically connecting the fifth metal layer to the second metal layer, at least two second vias penetrating a second interlayer insulation film provided between the first metal layer and the fourth metal layer and electrically connecting the first metal layer to the fourth metal layer, at least two third vias penetrating a third interlayer insulation film provided between the fourth metal layer and the third metal layer and electrically connecting the fourth metal layer to the third metal layer, and at least two fourth vias penetrating a fourth interlayer insulation film provided between the third metal layer and the fifth metal layer and electrically connecting the third metal layer to the fifth metal layer. A maximum interval between the first vias is larger than a width of the first metal layer and a maximum interval between the second vias, a maximum interval between the third vias is smaller than the maximum interval between the second vias, and the maximum interval between the first vias is larger than a maximum interval between the fourth vias.

BRIEF DESCRIPTION OF THE DRAWINGS

FIGS. 1(a) and 1(b) show a semiconductor device according to a first exemplary embodiment of the present invention, in which FIG. 1(a) is a plan view, and FIG. 1(b) is a cross-sectional view taken along line 1b-1b in FIG. 1(a).

DESCRIPTION OF EMBODIMENTS

Figure 1A:
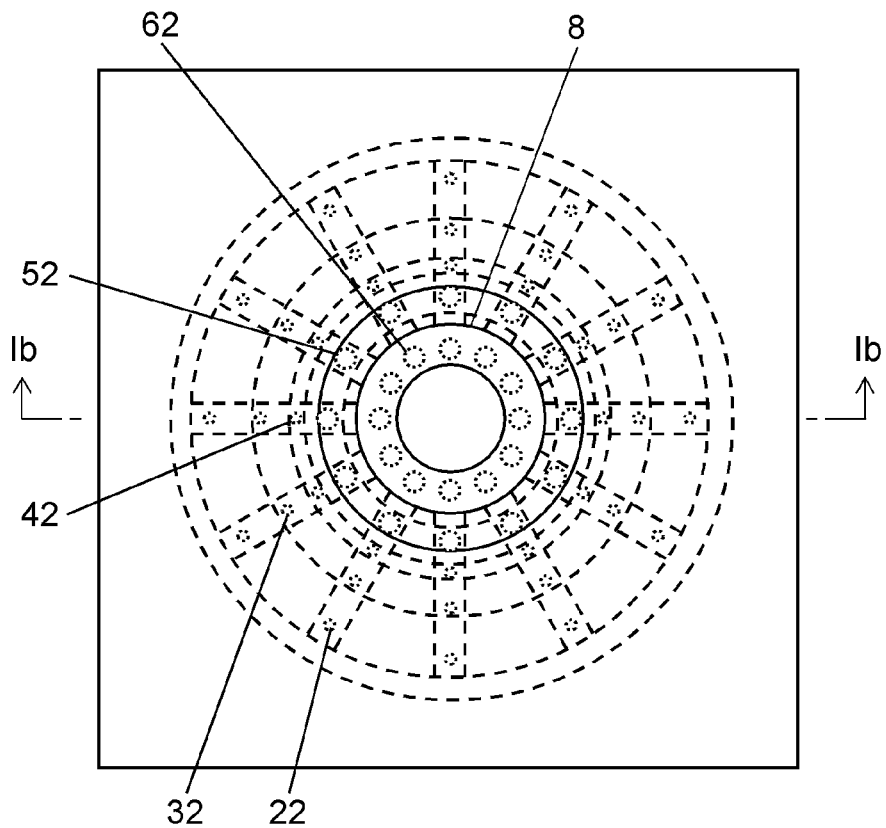

The conventional semiconductor device has the following problems. Specifically, in tandem with great development in miniaturization of a gate length, the permittivity of the interlayer insulation film becomes low, and the interlayer insulation film becomes more fragile. Meanwhile, in the assembling process, bonding pad 107 is subjected to a tensile stress. For example, in the stud bump forming process in the wire bonding method or the flip chip method, a metal wire is formed into a ball, is pressed to bonding pad 107, and then is pulled up. At this time, a great tensile stress is applied to bonding pad 107. In addition, a projection bump is formed of a solder material, gold, copper, or the like on bonding pad 107, and a back surface of a wafer is ground in a wafer back grinding process under the condition that a tip end of the bump is mounted on a dicing tape. Then, the bonding pad 107 is subjected to a great tensile stress when the dicing tape is peeled.

Thus, when the great tensile stress is applied to the bonding pad 107 formed on interlayer insulation films 103 to 106 which are fragile, that is, low in strength in the assembling process, the stress concentrates on vias 132 to 162 arranged in a direction perpendicular to a substrate surface of semiconductor substrate 101. For example, there is a problem that the stress concentrates on an interface between via 132 and stopper film 121, and interlayer insulation film 102 or interlayer insulation film 103 are fractured or peeled, starting from fragile interlayer insulation film 102 or interlayer insulation film 103.

In addition, in a cooling process after reflow (cooling from 240° C. to 260° C. to 20° C. to 30° C., for example), in a mounting process onto a mother board after a semiconductor package has been assembled, a great thermal stress is applied to bonding pad 107 in a tensile direction, similar to the above, there is a problem that the fracture or peeling is generated starting from fragile interlayer insulation film 102 or interlayer insulation film 103.

Furthermore, there is also a problem that crack fracture or peeling is generated in an interface between the fragile interlayer insulation films because the tensile stress is repeatedly applied under a usage environment in which a high temperature state and a low temperature state are repeated.

It is an object of the present invention to solve the above problems, and to ensure high connection reliability without generating a fracture and interface peeling of an interlayer insulation film even when a low permittivity film is used for the interlayer insulation film on which a pad electrode is provided.

First Exemplary Embodiment

A semiconductor device according to a first exemplary embodiment of the present invention will be described with reference to the drawings.

Figure 1B:
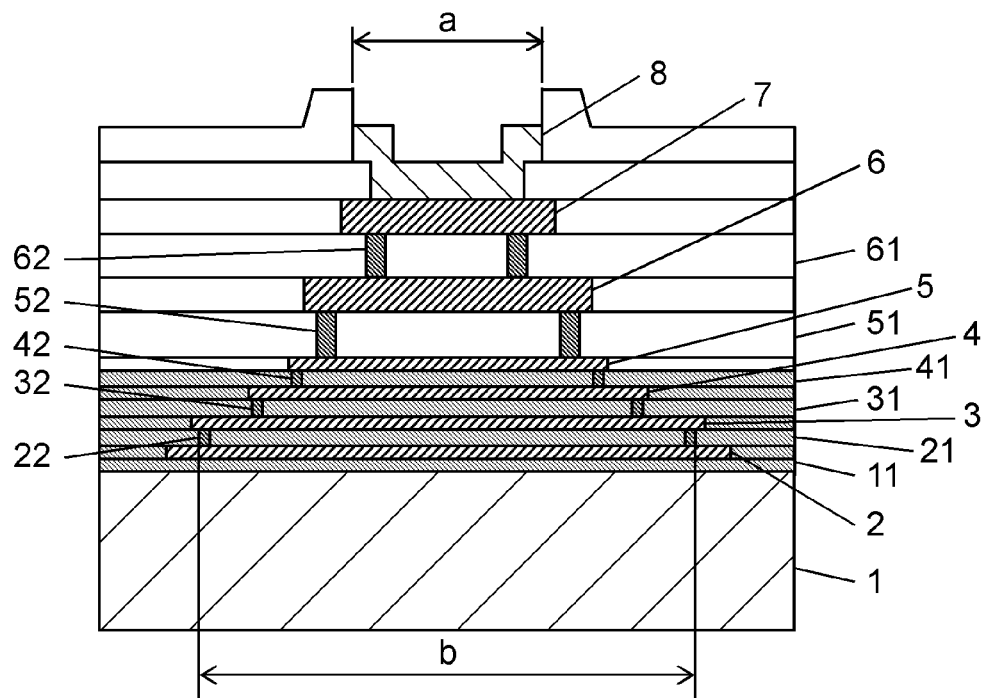

As shown in FIGS. 1(a) and 1(b), a multilayer wiring structure composing the semiconductor device according to the first exemplary embodiment is formed on semiconductor substrate 1 formed of silicon (Si), for example. The multilayer wiring structure is an externally connecting electrode, and formed by sequentially laminating interlayer insulation film 11, metal layer 2, interlayer insulation film 21, metal layer 3, interlayer insulation film 31, metal layer 4, interlayer insulation film 41, metal layer 5, interlayer insulation film 51, metal layer 6, interlayer insulation film 61, metal layer 7, and pad metal layer 8. In addition, the multilayer wiring structure may be formed directly above an element formation region on semiconductor substrate 1.

Interlayer insulation film 21, interlayer insulation film 31, interlayer insulation film 41, interlayer insulation film 51, and interlayer insulation film 61 each have at least two vias 22, vias 32, vias 42, vias 52, and vias 62, respectively, so as to establish electrical connections between metal layer 2 and metal layer 3, between metal layer 3 and metal layer 4, between metal layer 4 and metal layer 5, between metal layer 5 and metal layer 6, and between metal layer 6 and metal layer 7, respectively. Here, vias 22, 32, 42, 52, and 62 are arranged such that their maximum intervals in the same layers increase toward the layers closer to semiconductor device 1.

For each of interlayer insulation films 11, 21, 31, and 41, an insulation film having permittivity of 3.0 or lower is used. For example, for each of interlayer insulation films 11, 21, 31, and 41, an ELK (Extreme low-k) film having a film thickness of 100 nm to 200 nm and a permittivity of 2.4 is used. Meanwhile, for each of interlayer insulation films 51 and 61, a TEOS (Tetra-ethyl-ortho-silicate) film having a film thickness of 500 nm to 1000 nm and a permittivity of 4.3 is used.

Each of metal layers 2, 3, 4, 5, 6, and 7 is formed of a copper (Cu) or Cu alloy film containing a barrier metal including tantalum (Ta) or tantalum nitride (TaN). Each of vias 22, 32, 42, 52, and 62 is formed such that Cu or a Cu alloy is mainly buried. Pad metal layer 8 having an exposed upper surface is formed as an Al laminated film including aluminum (Al), and containing a barrier metal including titanium nitride (TiN)/titanium (Ti).

Hereinafter, a description will be made of characteristics of the multilayer wiring structure according to the first exemplary embodiment. As shown in FIG. 1(a), pad metal layer 8 has a planar circular shape, and its diameter (i.e. width) is indicated by a. Meanwhile, vias 22 formed on metal layer 2 which is closest to semiconductor substrate 1 are concentrically arranged in interlayer insulation film 21 at regular intervals. A maximum interval between vias 22 is indicated by b. Here, diameter a of pad metal layer 8 is formed so as to be smaller than maximum interval b between vias 22. In addition, a maximum interval between vias 62 formed under metal layer 7 is formed so as to be smaller than diameter a of pad metal layer 8. Furthermore, as for vias 52, 42, and 32 formed under metal layer 6, they are formed so that their maximum intervals increase toward lower layers and do not exceed b. For example, a is 50 μm, b is 100 μm, and the maximum intervals between vias 62, 52, 42, and 32 are 40 μm, 60 μm, 80 μm, and 90 μm, respectively.

In this way, diameter a of pad metal layer 8 is formed so as to be smaller than maximum interval b between vias 22 provided in the lowermost layer, and vias of layers are formed in a staircase pattern so that their maximum intervals increase toward the lower layers. Therefore, even when a tensile stress is applied to pad metal layer 8 at the time of assembling, the stress is sequentially transmitted and dispersed toward the vias formed in the staircase pattern, so that it is reduced. In addition, the tensile stress applied to metal layers 2, 3, 4, and 5 is reduced and alleviated by hard interlayer insulation film 51 and interlayer insulation film 61 which adhere to pad metal layer 8.

Therefore, since the tensile stress applied to metal layer 2 and the like each which is in contact with the fragile ELK film forming interlayer insulation film 11 and the like is reduced, the fragile interlayer insulation film is prevented from being peeled and cracked. As a result, high connection reliability can be ensured after assembling.

For example, a seed layer including titanium (Ti), tungsten (W), or copper (c), is formed on pad metal layer 8, and then an under bump metal including nickel (Ni), copper (Cu), or gold (Au) is formed on the seed layer. Then, a projection solder bump is formed of a solder material on the formed under bump metal. Then, after the formed solder bump side has been attached to a dicing tape, and a back grinding process has been performed for semiconductor substrate 1. Even when the multilayer wiring part positioned under pad metal layer 8 is cut by focused ion beam (FIB) thereafter, the fragile ELK film can be prevented from being peeled and cracked. In addition, the semiconductor device is diced into chips after the back grinding process, the semiconductor chip is mounted on a multilayer circuit board including glass epoxy to which flux is applied, and the solder bump is melted by a reflow furnace, whereby the semiconductor chip and the multilayer circuit board are bonded by the solder material. Then, a sealing resin is injected, and the injected sealing resin is hardened, whereby a semiconductor package is produced. Even when the semiconductor package produced as described above is put to a temperature cycle test which periodically repeats a high temperature state and a low temperature state, a fault such as an open fault can be prevented from being generated.

Thus, even when the semiconductor device according to the first exemplary embodiment undergoes the process such as the back grinding process, reflow process, or temperature cycle test in which pad metal layer 8 is subjected to the tensile stress, the fragile ELK film such as interlayer insulation film 11 is not peeled or cracked.

In addition, the structure in which four interlayer insulation films 11, 21, 31, and 41 serving as the ELK films are laminated is shown in this embodiment, but the structure is not limited to this. That is, it may be a structure in which fragile films having low permittivity are laminated, and vias can be provided for all the layers, without regard to the laminated number. In addition, the fragile interlayer insulation film is not limited to the ELK film, and when a film having a low permittivity such as a ULK (Ultra low-k) film or a carbon containing silicon oxide (SiOC) film is used, the fragile interlayer insulation film can be prevented from being peeled and cracked. Especially, the above effect can be obtained in the interlayer insulation film having a permittivity of 3.0 or lower.

According to the first exemplary embodiment, pad metal layer 8, and lower metal layers 2, 3, 4, 5, 6, and 7 are all have planar circular shape, but the shape is not limited to this. For example, each of the metal layers may be a plane rectangle, plane hexagon, plane octagon, or plane ellipse. Furthermore, pad metal layer 8, and lower metal layers 2, 3, 4, 5, 6, and 7 may be different in planar shape.

(First Variation of First Exemplary Embodiment)

Figure 2A:
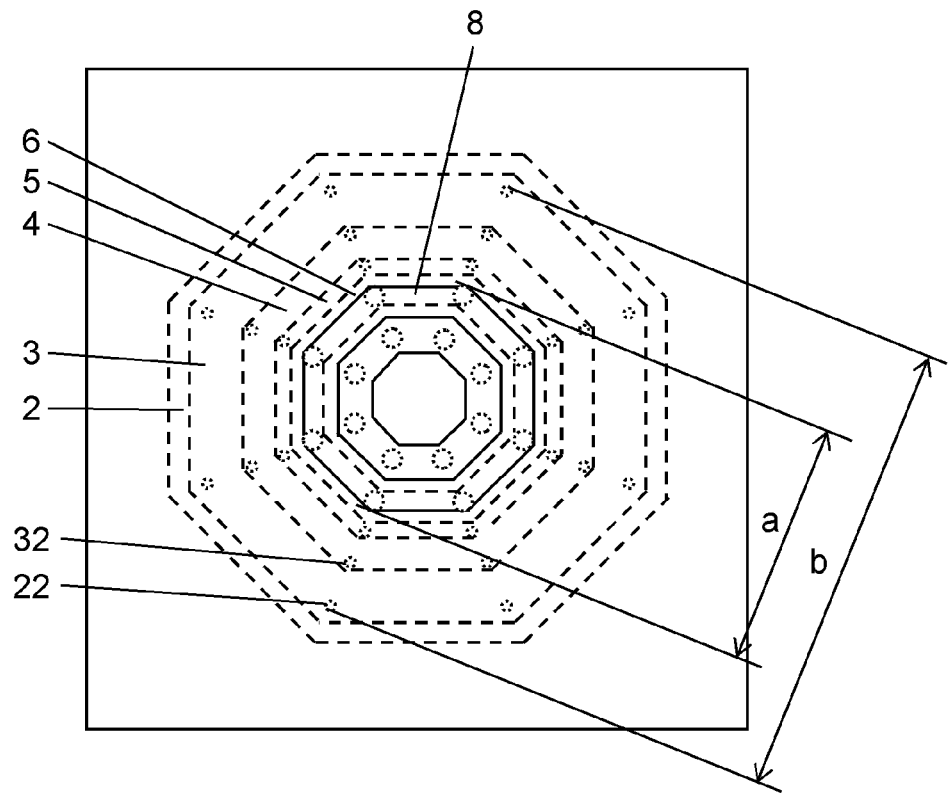
FIG. 2(a) is a plan view showing a semiconductor device according to a first variation of the first exemplary embodiment of the present invention.
Figure 2B:
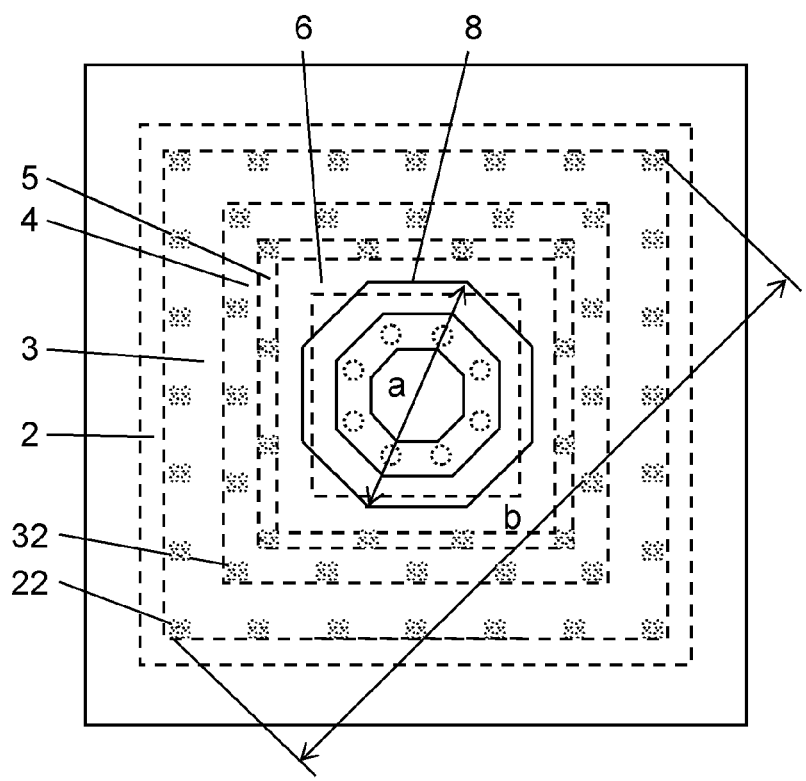
FIG. 2(b) is a plan view showing a semiconductor device according to a second variation of the first exemplary embodiment of the present invention.

FIG. 2 shows a semiconductor device according to a first variation of the first exemplary embodiment. As shown in FIG. 2(*a*), pad metal layer 8 and lower metal layers 2, 3, 4, 5, and 6 are all have a planar octagonal shape, and vias 22 and 32 are provided in the vicinity of vertexes of the octagon. In this configuration also, since maximum interval b between vias 22 on metal layer 2 is larger than width a of pad metal layer 8, the same effect as the first exemplary embodiment can be obtained.

(Second Variation of First Exemplary Embodiment)

As shown in FIG. 2(*b*), according to a semiconductor device in a second variation, a planar shape of pad metal layer 8 is an octagon, and a planar shape of lower metal layers 2, 3, 4, 5, and 6 is rectangle. In this configuration, since maximum interval b between vias 22 is larger than width a of pad metal layer 8, and its difference is larger than that of the first variation in FIG. 2(*a*), this can be effectively applied to a film having an extremely low permittivity (such as 2.2).

Second Exemplary Embodiment

Hereinafter, a semiconductor device according to a second exemplary embodiment of the present invention will be described with reference to the drawings.

Figure 3:
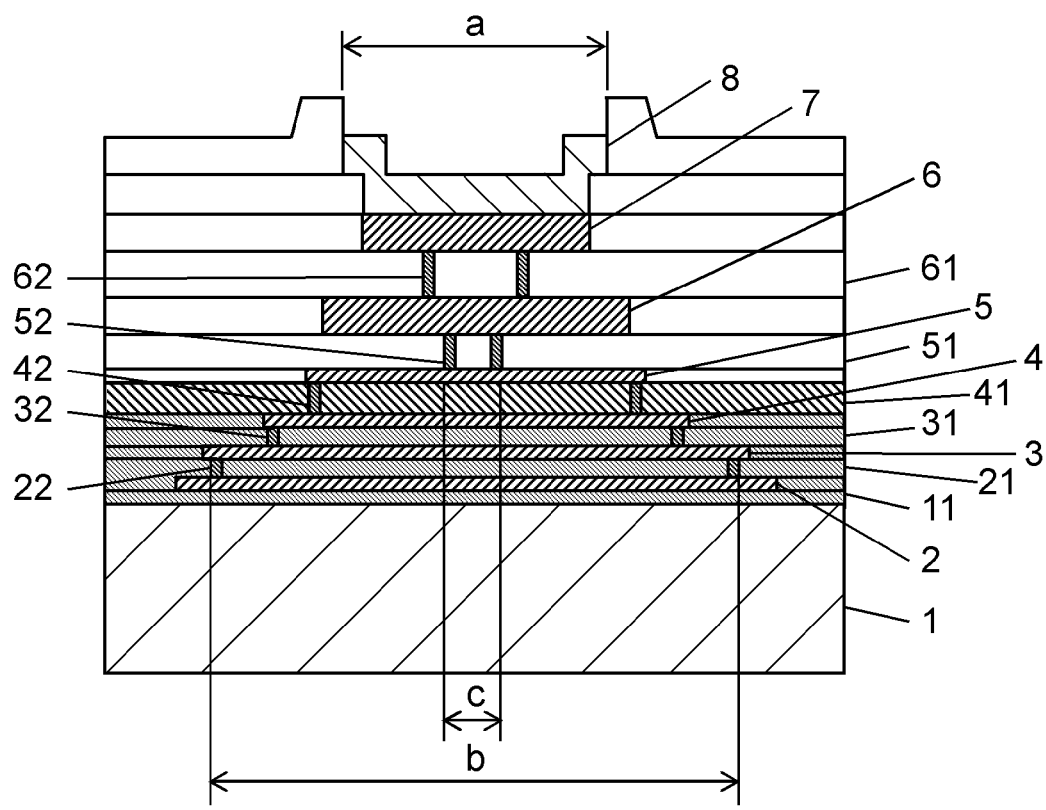
FIG. 3 is a cross-sectional view showing a semiconductor device according to a second exemplary embodiment of the present invention.

As shown in FIG. 3, a multilayer wiring structure composing the semiconductor device according to the second exemplary embodiment is formed on semiconductor substrate 1 formed of silicon (Si), for example. The multilayer wiring structure is an externally connecting electrode, and formed by sequentially laminating interlayer insulation film 11, metal layer 2, interlayer insulation film 21, metal layer 3, interlayer insulation film 31, metal layer 4, interlayer insulation film 41, metal layer 5, interlayer insulation film 51, metal layer 6, interlayer insulation film 61, metal layer 7, and pad metal layer 8. In addition, the multilayer wiring structure may be formed directly above an element formation region on semiconductor substrate 1.

Interlayer insulation film 21, interlayer insulation film 31, interlayer insulation film 41, interlayer insulation film 51, and interlayer insulation film 61 have at least two vias 22, vias 32, vias 42, vias 52, and vias 62, respectively. Vias 22 to 62 establish electrical connections between metal layer 2 and metal layer 3, between metal layer 3 and metal layer 4, between metal layer 4 and metal layer 5, between metal layer 5 and metal layer 6, and between metal layer 6 and metal layer 7, respectively.

For each of interlayer insulation films 11, 21, 31, and 41, an insulation film having a permittivity of 3.0 or lower is used. For example, each of interlayer insulation films 11, 21, and 31 is an ELK film having a thickness of 100 nm to 160 nm and a permittivity of 2.4, and interlayer insulation film 41 is a ULK film having a thickness of 160 nm to 250 nm and a permittivity of 2.8. In addition, each of interlayer insulation films 51 and 61 is a FSG (fluorosilicate glass) film having a thickness of 800 nm to 1200 nm and a permittivity of 3.8.

Each of metal layers 2, 3, 4, 5, 6, and 7 is formed of a Cu or Cu alloy film containing a barrier metal including Ta or TaN. Each of vias 22, 32, 42, 52, and 62 is formed such that Cu or a Cu alloy is mainly buried. Pad metal layer 8 having an exposed upper surface is formed as an Al laminated film including Al, and containing a barrier metal including TiN/Ti.

Hereinafter, a description will be made of characteristics of the multilayer wiring structure according to the second exemplary embodiment. Pad metal layer 8 whose upper surface is exposed has a planar octagonal shape, for example, and its diameter (maximum width) is indicated by a. Metal layer 7 formed so as to be in contact with a lower surface of pad metal layer 8 has a rectangular shape having a diameter smaller than that of pad metal layer 8. Furthermore, metal layer 6 formed under metal layer 7 is formed as a wiring in a region of a planar rectangular shape smaller than metal layer 7. Meanwhile, metal layers 5 to 2 under metal layer 6 are formed such that their diameters (maximum width) increase toward the layers closer to semiconductor substrate 1.

Thus, as for a maximum interval between vias in the same layer to connect each of metal layers 2 to 7, the maximum intervals between the vias decrease toward the lower layers from pad metal layer 8 to metal layer 5. In contrast, the maximum intervals between the vias increase toward the lower layers formed under metal layer 5. That is, when it is assumed that a represents a maximum dimension of pad metal layer, c represents a maximum interval between vias 52, and b represents a maximum interval between vias 42, these relationship is expressed by c<a<b. For example, a is 70 μm, b is 90 μm, and c is 55 μm.

Thus, according to the semiconductor device in the second exemplary embodiment, maximum interval b between vias 42 formed in interlayer insulation film 41 as the fragile ULK film having a low permittivity is larger than maximum interval c between vias 52 formed in interlayer insulation film 51 as the hard FSG film. Therefore, the tensile stress applied to vias 52 formed in the FSG film is reduced to be below a fracture stress of the ULK film and an interface stress of the film. As a result, interlayer insulation film 51 and interlayer insulation film 61 can be prevented from being cracked or peeled, and an interface of interlayer insulation film 51 and interlayer insulation film 41 can be prevented from being cracked or peeled.

Furthermore, in addition to the effect of reduction in stress applied to metal layer 5, since vias 42, 32, and 22 are arranged so as to spread in a staircase pattern toward the lower layers, the stress applied to the fragile ULK film and the stress applied to the fragile ELK film are considerably reduced, so that interlayer insulation films 11 to 31 as the ELK film can be effectively prevented from peeled or cracked.

Third Exemplary Embodiment

Hereinafter, a semiconductor device according to a third exemplary embodiment of the present invention will be described with reference to the drawings.

Figure 4:
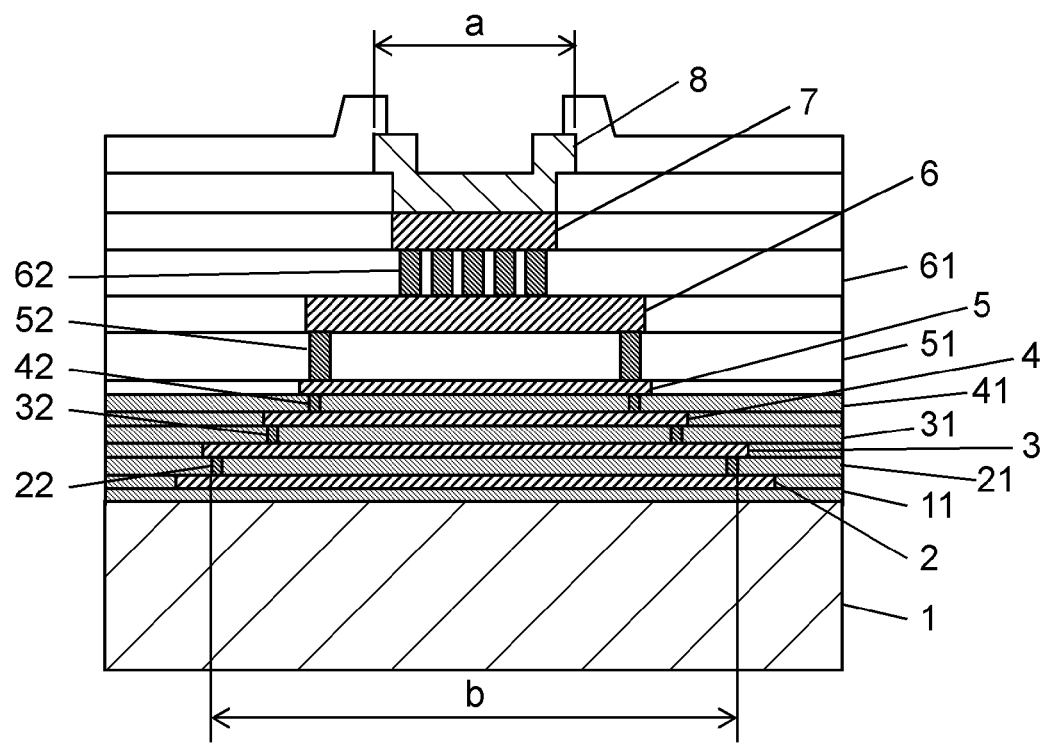
FIG. 4 is a cross-sectional view showing a semiconductor device according to a third exemplary embodiment of the present invention.

As shown in FIG. 4, a multilayer wiring structure composing the semiconductor device according to the third exemplary embodiment is formed on semiconductor substrate 1 formed of silicon (Si), for example. The multilayer wiring structure is an externally connecting electrode, and formed by sequentially laminating interlayer insulation film 11, metal layer 2, interlayer insulation film 21, metal layer 3, interlayer insulation film 31, metal layer 4, interlayer insulation film 41, metal layer 5, interlayer insulation film 51, metal layer 6, interlayer insulation film 61, metal layer 7, and pad metal layer 8. In addition, the multilayer wiring structure may be formed directly above an element formation region on semiconductor substrate 1.

Interlayer insulation film 21, interlayer insulation film 31, interlayer insulation film 41, interlayer insulation film 51, and interlayer insulation film 61 have at least two vias 22, vias 32, vias 42, vias 52, and vias 62, respectively. Vias 22 to 62 establish electrical connections between metal layer 2 and metal layer 3, between metal layer 3 and metal layer 4, between metal layer 4 and metal layer 5, between metal layer 5 and metal layer 6, and between metal layer 6 and metal layer 7, respectively.

For each of interlayer insulation films 11, 21, 31, and 41, an insulation film having permittivity of 3.0 or lower is used. For example, for each of interlayer insulation films 11, 21, 31, and 41, a ULK film having a thickness of 100 nm to 160 nm and a permittivity of 2.7 is used. Meanwhile, for each of interlayer insulation films 51 and 61, a SiOC film having a thickness of 800 nm to 1200 nm and a permittivity of 4.7 is used.

Each of metal layers 2, 3, 4, 5, 6, and 7 is formed of a Cu or Cu alloy film containing a barrier metal including Ta or TaN. Each of vias 22, 32, 42, 52, and 62 is formed such that Cu or a Cu alloy is mainly buried. Pad metal layer 8 having an exposed upper surface is formed as an Al laminated film including Al, and containing a barrier metal including TiN/Ti.

Hereinafter, a description will be made of characteristics of the multilayer wiring structure according to the third exemplary embodiment. Pad metal layer 8 whose upper surface is exposed has a planar circular shape, and its diameter is indicated by a. Metal layer 7 formed so as to be in contact with a lower surface of metal layer 8 has a circular shape having a diameter smaller than that of pad metal layer 8. Furthermore, metal layer 6 formed under metal layer 7 is formed as a wiring in a region of a planar rectangular shape larger than metal layer 7. In addition, the metal layers 5 to 2 under metal layer 6 are formed such that their diameters increase toward layers closer to semiconductor substrate 1. As for the layers below metal layer 6, maximum intervals between the vias increase toward the lower layers.

Furthermore, vias 62 formed between metal layer 6 and metal layer 7 are arranged in a two-dimensional manner at regular intervals so as to cover a whole lower surface of metal layer 7. Here, when it is assumed that a diameter of metal layer 7 is 50 μm, a diameter of via 62 is 5 μm, and an interval between vias 62 is 10 μm. In addition, vias 52 are formed under metal layer 6, so as not to be arranged just under via 62.

Thus, according to the third exemplary embodiment, since vias 62 are provided in the two-dimensional manner under metal layer 7 formed so as to be in contact with the lower surface of pad metal layer 8, a stress applied to pad metal layer 8 is intensively applied to a lower part of the region on which vias 62 are arranged, in an interface of metal layer 6 and interlayer insulation film 51. Furthermore, since interlayer insulation film 51 is a strong film formed of SiCO, it is not peeled and cracked by a stress generated in an assembly process. Furthermore, even when the tensile stress is applied to vias 52, since vias 52 are arranged outside vias 62, a tensile stress is reduced due to strong interlayer insulation film 51, so that interlayer insulation film 51 can be prevented from being cracked and peeled.

For example, a gold ball is formed on pad metal layer 8 by discharging a gold wire having a diameter of 25 μm using a stud bump bonding technique, and the gold ball and pad metal layer 8 including Al are bonded to each other by applying ultrasonic sounds while being heated under pressure. Then, the gold wire is pulled up and cut under the condition that semiconductor substrate 1 is fixed by vacuum contact. Even when the stud bump is formed through the above processes, interlayer insulation film 51 can be prevented from being peeled and cracked.

Fourth Exemplary Embodiment

Hereinafter, a semiconductor device according to a fourth exemplary embodiment of the present invention will be described with reference to the drawings.

Figure 5:
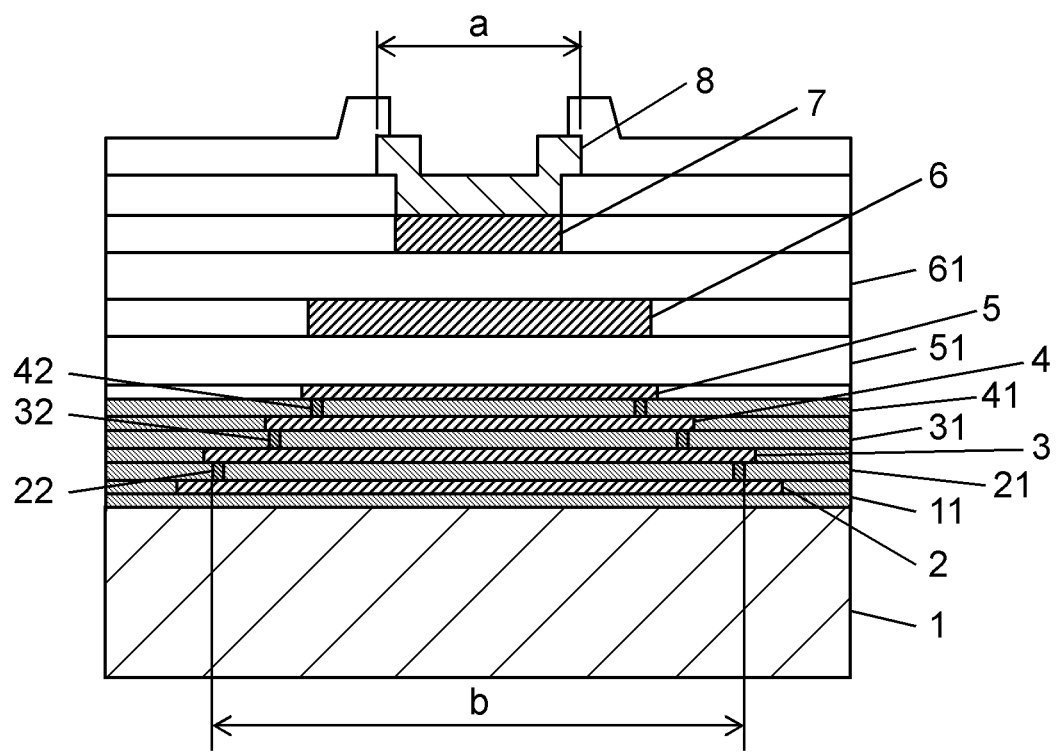
FIG. 5 is a cross-sectional view showing a semiconductor device according to a fourth exemplary embodiment of the present invention.
Figure 6:
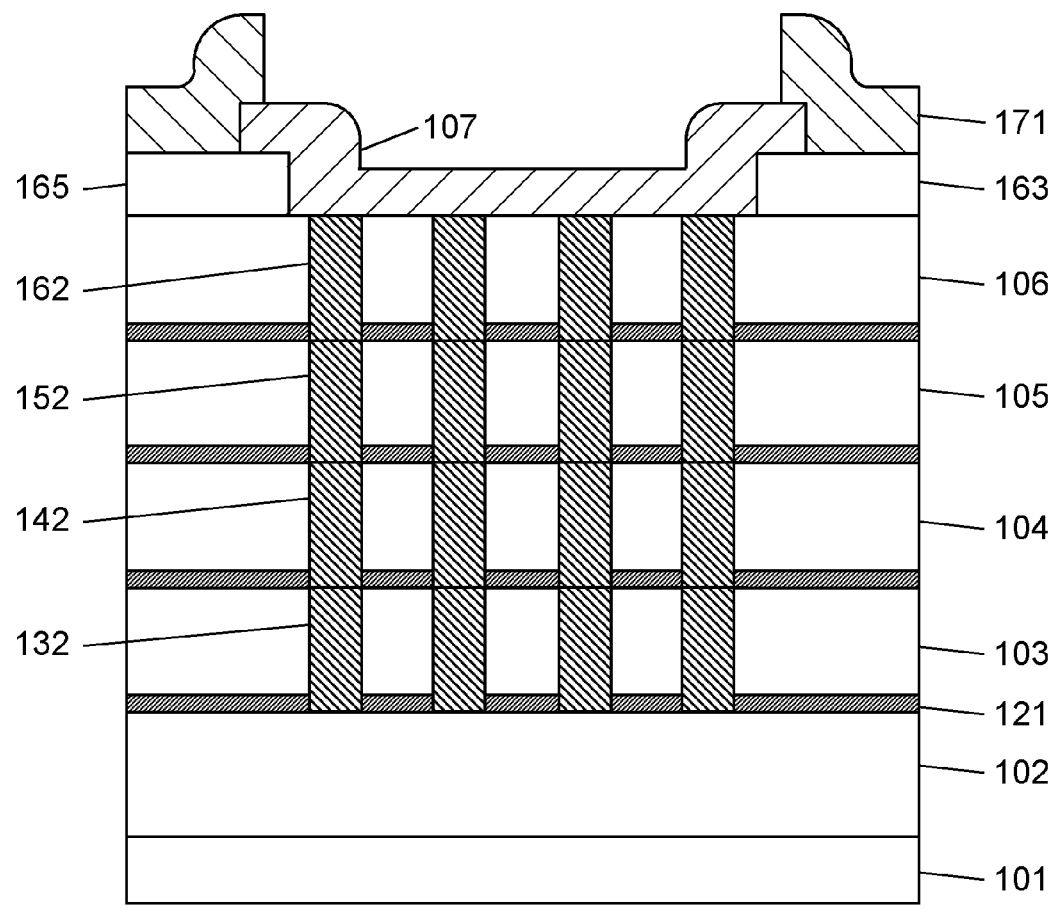
FIG. 6 is a cross-sectional view showing a semiconductor device according to a conventional example.

As shown in FIG. 5, a multilayer wiring structure composing the semiconductor device according to the fourth exemplary embodiment is formed on semiconductor substrate 1 formed of silicon (Si), for example. The multilayer wiring structure is an externally connecting electrode, and formed by sequentially laminating interlayer insulation film 11, metal layer 2, interlayer insulation film 21, metal layer 3, interlayer insulation film 31, metal layer 4, interlayer insulation film 41, metal layer 5, interlayer insulation film 51, metal layer 6, interlayer insulation film 61, metal layer 7, and pad metal layer 8. In addition, the multilayer wiring structure may be formed directly above an element formation region on semiconductor substrate 1.

For each of interlayer insulation films 11, 21, 31, and 41, an insulation film having a permittivity of 3.0 or lower is used. For example, for each of interlayer insulation films 11, 21, 31, and 41, an ELK film having a thickness of 150 nm to 200 nm and a permittivity of 2.4 is used. Meanwhile, for each of interlayer insulation films 51 and 61, a TEOS film having a thickness of 700 nm to 800 nm and a permittivity of 4.3 is used.

Each of metal layers 2, 3, 4, 5, 6, and 7 is formed of a Cu or Cu alloy film containing barrier metal including Ta or TaN. Pad metal layer 8 having an exposed upper surface is formed as an Al laminated film including Al, and containing barrier metal including TiN/Ti.

As characteristics of the fourth exemplary embodiment, interlayer insulation film 21, interlayer insulation film 31, and interlayer insulation film 41 have at least two vias 22, vias 32, and vias 42 formed such that Cu or a Cu alloy is mainly buried, respectively. Vias 22 to 42 establish electrical connections between metal layer 2 and metal layer 3, between metal layer 3 and metal layer 4, and between metal layer 4 and metal layer 5, respectively. In contrast, a via is not provided between metal layers 5 and 6, and between metal layer 6 and 7, but interlayer insulation film 51 is only provided between metal layers 5 and 6 and interlayer insulation film 61 is only provided between metal layer 6 and 7.

Maximum interval b between vias 42 is provided so as to be larger than dimension a of pad metal layer 8, and the maximum intervals between vias 32 and between vias 22 serving as the lower layers are provided so as to be larger than that in their upper layer.

Thus, according to the fourth exemplary embodiment, since a whole surface of interlayer insulation film 51 receives a tensile stress applied to pad metal layer 8, the stress is reduced and transmitted to the layers lower than interlayer insulation film 51. In addition, maximum interval b between vias 42 formed in interlayer insulation film 41 is larger than dimension a of pad metal layer 8. Therefore, a stress applied to the fragile ELK film itself serving as interlayer insulation film 41, and a stress applied to its interface is reduced to less than film strength and interface strength. As a result, fragile interlayer insulation film 41 is prevented from being peeled and cracked. Similarly, film fracture and interface fracture are prevented from being generated in interlayer insulation film 31 and interlayer insulation film 21 which are the ELK films.

In addition, the description has been made of the case where the film thicknesses of interlayer insulation films increase toward upper layers from semiconductor substrate 1 in the above first to fourth exemplary embodiments, but the configuration is not limited to this. While the tensile stress is reduced by enlarging the maximum interval between vias in each exemplary embodiment, a film thickness of the fragile interlayer insulation film can be increased as long as the stress is less than the fracture stress of the film. For example, the interlayer insulation film positioned lower than the fragile ELK film may be thick.

For example, as another configuration, interlayer insulation films 11, 21, and 31 may be ELK films, and a thickness of each insulation film may be 250 nm. Meanwhile, interlayer insulation film 41 and interlayer insulation film 51 may be FSG film, and a thickness of each layer may be 150 nm.

In addition, in each exemplary embodiment, a center point between two vias 22 between which the maximum interval is provided and a center point between two vias 62 between which the maximum interval is provided, for example, may be on a straight line perpendicular to a main surface of semiconductor substrate 1.

In addition, centroids of metal layers 2 and 7, for example, may be on a straight line perpendicular to the main surface of semiconductor substrate 1.

As described above, according to the present invention, a semiconductor device is configured such that a maximum interval between vias formed between a bonding pad (externally connecting electrode) and a metal layer provided under the bonding pad with an insulation film interposed therebetween is larger than a width of the bonding pad.

More specifically, a first semiconductor device according to the present invention includes an externally connecting electrode formed on a semiconductor substrate with at least two interlayer insulation films disposed in the externally connecting electrode The externally connecting electrode has a first metal layer having an exposed upper surface, a second metal layer formed between the first metal layer and the semiconductor substrate, a third metal layer formed between the first metal layer and the second metal layer, and at least two first vias penetrating a first interlayer insulation film provided between the second metal layer and the third metal layer and electrically connecting the second metal layer to the third metal layer. A maximum interval between the first vias is larger than a width of the first metal layer.

According to the first semiconductor device in the present invention, a tensile stress applied to the first metal layer is reduced because it is dispersed and transmitted to at least two vias provided on the second metal layer. In addition, since the maximum interval between the vias formed on the second metal layer to which the tensile stress is applied is larger than the width of the first metal layer, the tensile stress applied to the second metal layer is reduced. Thus, since the fragile interlayer insulation film formed on the second metal layer can be prevented from being peeled and cracked, high connection reliability can be ensured after the assembling.

According to the first semiconductor device of the present invention, it is preferable that the external connecting electrode further has at least two second vias penetrating a second interlayer insulation film provided between the first metal layer and the third metal layer and electrically connecting the first metal layer to the third metal layer, and the maximum interval between the first vias is larger than a maximum interval between the second vias.

Thus, the tensile stress applied to the first metal layer is transmitted through the first vias having the large interval and dispersed to the substrate side, so that it is further reduced. In addition, since an area of the second metal layer subjected to the tensile stress is larger than an area of the first metal layer, the tensile stress applied to the second metal layer is reduced.

Furthermore, since all the region of the metal layer subjected to the tensile stress is held by the interlayer insulation film, the tensile stress applied to the second metal layer is reduced, so that the interlayer insulation film can be effectively prevented from being peeled and cracked. In addition, since the tensile stress can concentrate on the third metal layer, the tensile stress transmitted to the fragile interlayer insulation film provided under the third metal layer can be reduced when a hard insulation film is used for the interlayer insulation film which is in contact with the first metal layer, so that the interlayer insulation film can be effectively prevented from being peeled and cracked.

In this case, a permittivity of the first interlayer insulation film may be lower than a permittivity of the second interlayer insulation film.

Thus, since the maximum interval between the first vias provided in the first interlayer insulation film having a low permittivity becomes large, the tensile stress applied to the first metal layer can be reduced, so that the first interlayer insulation film can be prevented from being fractured and delaminated.

In this case, a thickness of the first interlayer insulation film may be equal to or larger than a thickness of the second interlayer insulation film.

Thus, even when the thickness of the first interlayer insulation film having the low permittivity is equal to or larger than the thickness of the second interlayer insulation film, the tensile stress applied to the first interlayer insulation film does not exceed fracture strength of the film, so that the fracture and peeling can be prevented. Therefore, when the first interlayer insulation film is thick, the permittivity of the interlayer insulation film can be lowered, so that the wiring delay can be minimized.

In addition, in this case, the thickness of the first interlayer insulation film may be equal to or smaller than the second interlayer insulation film. Thus, the strength of the semiconductor device can be surely improved.

In addition, in the case where the semiconductor device of the present invention has the second vias, at least three second vias may be provided in a two-dimensional manner.

Thus, since the stress just under the first metal layer can be reduced by the three or more vias, the interlayer insulation film can be more effectively prevented from being peeled and cracked.

In addition, the via may not be directly provided in the first metal layer, in the first semiconductor device.

Thus, since the whole surface of the interlayer insulation film provided just under the first metal layer receives the tensile stress applied to the first pad metal, the stress applied to the second metal layer can be further reduced. As a result, since the tensile stress applied to the second metal layer is reduced, the fragile interlayer insulation film provided on the second metal layer can be prevented from being peeled and cracked, so that high connection reliability can be ensured after the assembling.

A second semiconductor device according to the present invention includes an externally connecting electrode formed on a semiconductor substrate with at least two interlayer insulation films disposed in the externally connecting electrode. The externally connecting electrode has a first metal layer having an exposed upper surface, a second metal layer formed between the first metal layer and the semiconductor substrate, a third metal layer formed between the first metal layer and the second metal layer, a fourth metal layer formed between the first metal layer and the third metal layer, a fifth metal layer formed between the third metal layer and the second metal layer, at least two first vias penetrating a first interlayer insulation film provided between the fifth metal layer and the second metal layer and electrically connecting the fifth metal layer to the second metal layer, at least two second vias penetrating a second interlayer insulation film provided between the first metal layer and the fourth metal layer and electrically connecting the first metal layer to the fourth metal layer, at least two third vias penetrating a third interlayer insulation film provided between the fourth metal layer and the third metal layer and electrically connecting the fourth metal layer to the third metal layer, and at least two fourth vias penetrating a fourth interlayer insulation film provided between the third metal layer and the fifth metal layer and electrically connecting the third metal layer to the fifth metal layer. A maximum interval between the first vias is larger than a width of the first metal layer and a maximum interval between the second vias, a maximum interval between the third vias is smaller than the maximum interval between the second vias, and the maximum interval between the first vias is larger than a maximum interval between the fourth vias.

According to the second semiconductor device in the present invention, when the low permittivity interlayer insulation film is provided under the third metal layer, the tensile stress applied to this fragile interlayer insulation film can be further reduced, so that the interlayer insulation film can be effectively prevented from being peeled and cracked.

In addition, according to the first or second semiconductor device of the present invention, the permittivity of the first interlayer insulation film may be 3.0 or lower.

In addition, according the first or second semiconductor device of the present invention, the semiconductor substrate may have an element formation region having a semiconductor element, and the externally connecting electrode may be formed directly above the element formation region.

According to the first or second semiconductor device of the present invention, a center point between two first vias between which the maximum interval is provided and a center point between two second vias between which the maximum interval is provided are on a straight line perpendicular to a main surface of the semiconductor substrate.

In addition, according to the first or second semiconductor device of the present invention, centroids of the metal layers may be on a straight line perpendicular to the main surface of the semiconductor substrate.

According to the semiconductor device in the present invention, even when the low permittivity film is used for the interlayer insulation film on which the pad electrode is provided, the interlayer insulation film can be prevented from being fractured and delaminated, and high connection reliability can be ensured after the assembling.

The semiconductor device according to the present invention is useful for a semiconductor device provided with an input/output pad directly above an element formation region without generating fracture and interface peeling in an interlayer insulation film even when a low permittivity film is used for an interlayer insulation film on which a pad electrode is provided.

What is claimed is:
1. A semiconductor device comprising:
 a semiconductor substrate;
 a first metal layer being a pad metal la er of the semiconductor device;
 a second metal layer disposed between the first metal layer and the semiconductor substrate;
 a third metal layer disposed between the first metal layer and the second metal layer;

a first interlayer insulation film disposed between the second metal layer and the third metal layer; and
a plurality of first vias penetrating the first interlayer insulation film for electrically connecting the second metal layer to the third metal layer, the plurality of first vias disposed outside of a plane defined by an outer periphery of the first metal layer extending below the first metal layer;
a second interlayer insulation film provided between the first metal layer and the third metal layer; and
a plurality of second vias penetrating the second interlayer insulation film,
wherein two of the first vias are aligned so that a shortest distance therebetween passes directly under the first metal layer, and
an interval between the two of the first vias is larger than a width of the first metal layer, and an interval between two of the second vias not having others of the second vias electrically connecting the first metal layer to the third metal layer therebetween.

2. The semiconductor device according to claim 1, wherein a permittivity of the first interlayer insulation film is lower than a permittivity of the second interlayer insulation film.

3. The semiconductor device according to claim 2, wherein the first interlayer insulation film is not thicker than the second interlayer insulation film.

4. The semiconductor device according to claim 2, wherein the first interlayer insulation film is not thinner than the second interlayer insulation film.

5. The semiconductor device according to claim 4, wherein at least three of the second vias are provided in a two-dimensional manner.

6. The semiconductor device according to claim 5, wherein the permittivity of the first interlayer insulation film is 3.0 or lower.

7. The semiconductor device according to claim 6, wherein the semiconductor substrate has an element formation region having a semiconductor element, and
the first, second and third metal layers are disposed directly above the element formation region.

8. The semiconductor device according to claim 7, wherein a center point between the two of the first vias and a center point between the two of the second vias are aligned together in a direction perpendicular to a main surface of the semiconductor substrate.

9. The semiconductor device according to claim 8, wherein centroids of the metal layers are aligned together in a direction perpendicular to the main surface of the semiconductor substrate.

10. The semiconductor device of claim 1, wherein the plurality of first vias are concentrically arranged at regular intervals, and the plurality of second vias are concentrically arranged at regular intervals.

11. The semiconductor device of claim 1, wherein the second metal layer is continuous between the two of first vias, and
the third metal layer is continuous between the two of second vias.

12. The semiconductor device of claim 1, wherein the second metal layer and the third metal layer are disposed directly below the pad metal layer, and not disposed overlapping other pad metal layers adjacent to the first metal layer.

13. The semiconductor device of claim 1, wherein the two of the second vias are aligned so that a shortest distance therebetween passes directly under the first metal layer.

14. The semiconductor device of claim 1, wherein the interval between the two of the first vias is the maximum interval within the plurality of first vias, and
the interval between the two of the second vias is the maximum interval within the plurality of second vias.

15. A semiconductor device comprising:
a semiconductor substrate;
a first metal layer being a pad metal layer of the semiconductor device;
a second metal layer disposed between the first metal layer and the semiconductor substrate;
a third metal layer disposed between the first metal layer and the second metal layer;
a first interlayer insulation film disposed between the second metal layer and the third metal layer; and
a plurality of first vias penetrating the first interlayer insulation film for electrically connecting the second al layer, er, the plurality of first vias disposed outside of a plane defined by an outer periphery of the first metal layer extending below the first metal layer,
wherein two of the first vias are aligned so that a shortest distance therebetween passes directly under the first metal layer,
an interval between the two of the first vias is larger than a width of the first metal layer, and
no other first vias are disposed on the shortest distance between the two of the first vias.

16. A semiconductor device comprising:
a semiconductor substrate;
a first metal layer being a pad metal layer of the semiconductor device;
a second metal layer disposed between the first metal layer and the semiconductor substrate;
a third metal layer disposed between the first metal layer and the second metal layer;
a first interlayer insulation film disposed between the second metal layer and the third metal layer; and
a plurality of first vias penetrating the first interlayer insulation film for electrically connecting the second metal layer to the third metal layer, the plurality of first vias disposed outside of a plane defined by an outer periphery of the first metal layer extending below the first metal layer, wherein
there are no other vias penetrating the first interlayer insulation film directly below the first metal.

17. A semiconductor device comprising an externally connecting electrode formed on a semiconductor substrate with at least two interlayer insulation films disposed in the externally connecting electrode, wherein
the externally connecting electrode has:
a first metal layer having an exposed upper surface;
a second metal layer formed between the first metal layer and the semiconductor substrate;
a third metal layer formed between the first metal layer and the second metal layer; and
at least two first vias penetrating a first interlayer insulation film provided between the second metal layer and the third metal layer for electrically connecting the second metal layer to the third metal layer, and
a maximum interval between the first vias is larger than a width of the first metal layer,
the external connecting electrode further has at least two second vias penetrating a second interlayer insulation film provided between the first metal layer and the third metal layer for electrically connecting the first metal layer to the third metal layer, the maximum interval between the first vias is larger than a maximum interval between the second vias, and a permittivity of the first interlayer insulation film is lower than a permittivity of the second interlayer insulation film.

* * * * *